United States Patent [19]
Azegami

[11] 3,775,692
[45] Nov. 27, 1973

[54] DRIFT COMPENSATION CIRCUIT

[75] Inventor: Tadashi Azegami, Tokyo, Japan

[73] Assignee: Fisher & Porter Company, Warminster, Pa.

[22] Filed: Oct. 20, 1972

[21] Appl. No.: 299,271

[30] Foreign Application Priority Data

Oct. 30, 1971 Japan .............................. 46/86568

[52] U.S. Cl. ................. 328/151, 307/246, 307/264, 328/164, 328/175, 340/347 SH

[51] Int. Cl. ........................... H03f 1/10, H03k 5/18

[58] Field of Search .................... 307/235 R, 235 A, 307/246, 264, 229; 328/151, 162, 164, 168, 172, 173, 175; 340/347 SH

[56] References Cited

UNITED STATES PATENTS

| | | | |
|---|---|---|---|
| 3,059,228 | 10/1962 | Beck et al. | 340/347 SH X |
| 3,104,358 | 9/1963 | Heacock, Jr. | 328/175 |
| 3,355,719 | 11/1967 | Fox | 340/347 SH X |
| 3,411,018 | 11/1968 | Dapper | 307/235 R |
| 3,475,600 | 10/1969 | Spence | 328/162 X |
| 3,516,002 | 6/1970 | Hillis | 340/347 SH X |
| 3,541,319 | 11/1970 | James | 328/151 X |
| 3,541,320 | 11/1970 | Beall | 328/151 X |
| 3,555,298 | 1/1971 | Neelands | 328/151 X |
| 3,633,004 | 1/1972 | James et al. | 328/151 X |
| 3,636,462 | 1/1972 | Baldauf, Jr. | 328/175 X |

*Primary Examiner*—John W. Huckert
*Assistant Examiner*—L. N. Anagnos
*Attorney*—Michael Ebert

[57] ABSTRACT

A drift-compensated, electronic sample hold circuit for delivering a control signal to a valve or other final control element in a process control system in order to hold its position. The sample hold circuit is constituted by an amplifier and a memory capacitor. The drift compensation means associated with the sample hold circuit comprises a converter that converts the output of the sample hold circuit to a pulse train signal whose frequency is a function of the output voltage of the sample hold circuit, a clock pulse generator that yields a clock pulse signal having a predetermined frequency, an AND gate responsive to the pulse train signal and the clock pulse signal to produce an output signal only when the signals applied thereto overlap, and a sample drive circuit responsive to the output signal from the AND gate to produce a compensation signal which is fed to the input of the sample hold circuit.

1 Claim, 5 Drawing Figures

DRIFT COMPENSATION CIRCUIT

BACKGROUND OF INVENTION

This invention relates generally to process control systems, and more particularly to an electronic circuit adapted to compensate for the drift of a sample hold circuit.

In process control technology, it was heretofore customary to use a mechanical memory device, such as a potentiometer, to deliver a control signal to a valve in order to hold its position. However, such a mechanical device has tendency to wear. Furthermore, it requires an expensive servomechanism to track an external signal. To overcome these shortcomings, an electronic sample hold circuit also has been used for the same purpose. In this instance, an amplifier with a memory capacitor functions electronically to drive the valve. With an electronic circuit of this type, tracking of the external signal is relatively inexpensive.

However, this new electronic method has given rise to another problem, namely drive of the output. The charge stored in the capacitor will decay through the leakage resistance of the capacitor and the finite impedance of the amplifier, thereby changing the output with respect to time. Even when combining a high quality plastic-film capacitor and a high impedance amplifier having an input bias current of less than several pA, and being careful to maintain insulation resistance of the printed circuit board etc., it still has been difficult to reduce the output drift rate $\Delta Eo/Eo$ to below 1%/100 hr. This situation is particularly aggravated under environmental conditions of high temperature and high humidity.

SUMMARY OF INVENTION

The main object of this invention is to provide a drift-free sample hold circuit having incorporated therein a simple and effective drift compensation circuit.

Briefly stated, a drift-free sample hold circuit in accordance with the invention is realized by:

a. Means which converts the output voltage of the sample hold circuit to a pulse train signal.
b. Means which compares the pulse train signal with a reference clock pulse to detect the amount of drift to produce a time-based signal as a function thereof.
c. Means which feeds a compensation signal to the sample hold circuit upon receiving the time-based drift signal.

OUTLINE OF DRAWING

For a better understanding of the invention as well as other objects and features thereof, reference is made to the following description to be read in conjunction with the accompanying drawing wherein:

FIG. 1 shows the basic block diagram of a system in accordance with the invention;

FIG. 2 (A–c) graphically illustrates the operating principles underlying the invention;

DESCRIPTION OF INVENTION

Figures 1, 2, 5:
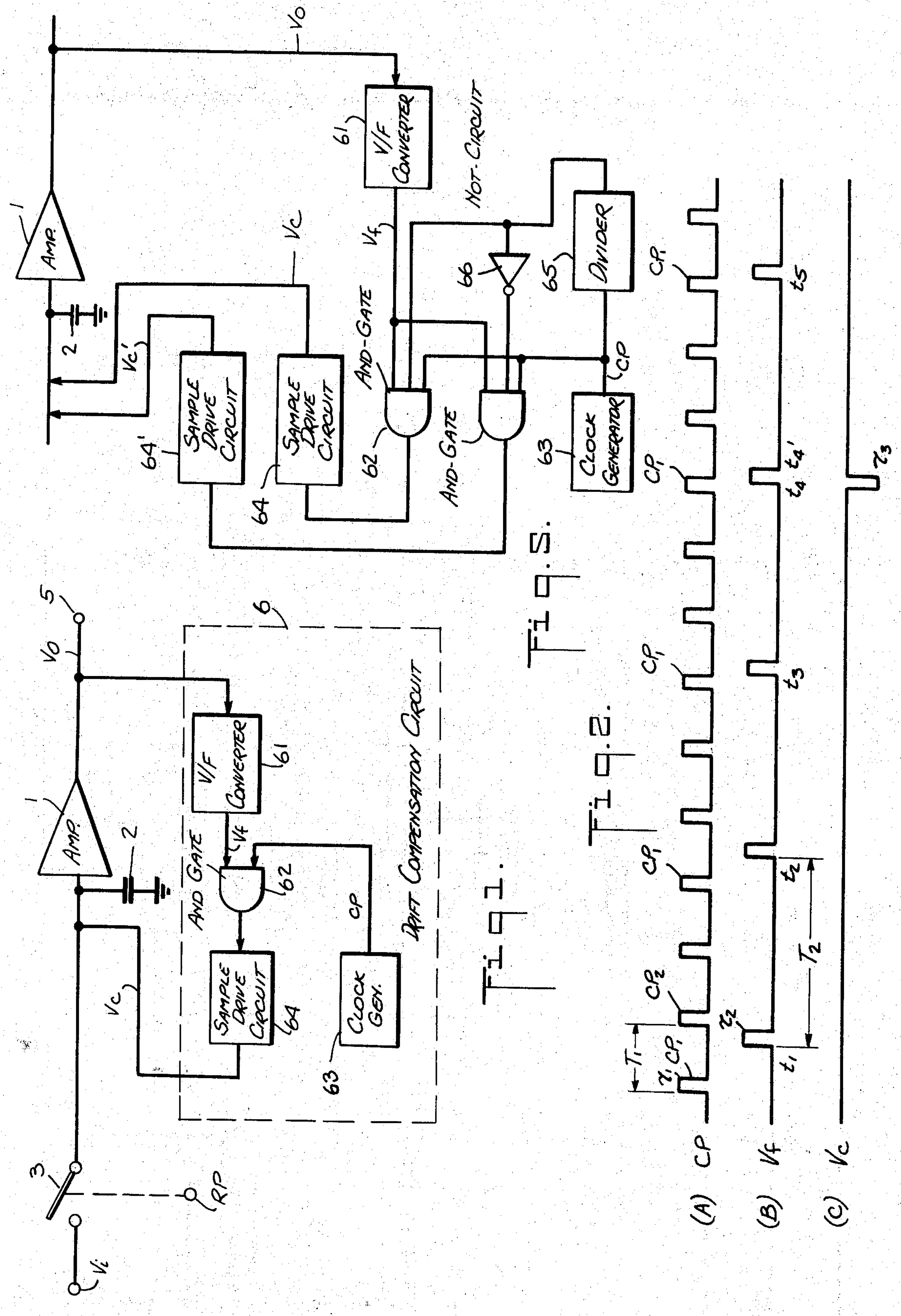
FIG. 5 shows a modified system to which the concept of the invention is also applicable.

In FIG. 1 a sample hold circuit is composed of an amplifier 1 and a capacitor 2 connected to the input circuit of the amplifier. The sampler 3 is controlled by the control signal RP and acts to convert a sample signal V*i* fed into the input of the amplifier into pulse form. The pulse has the same repetition rate as the signal RP applied to sampler 3 but its amplitude is dependent upon the values of the sample signal V*i*.

The output of sampler 3 is held by capacitor 2, and the voltage charge of capacitor 2 is applied to the input side of amplifier 1. Therefore, amplifier 1, which has a high impedance and a predetermined gain, produces at output terminal 5 a constant output V*o* equal in magnitude to that of the preceding pulse.

In FIG. 1, associated with the sample hold circuit is a drift compensation circuit constituted by a voltage-to-frequency (V/F) converter 61 coupled to the output of amplifier 1 that produces a pulse train signal V*f*. This pulse train signal is applied to one input of an AND gate 62 to whose other input is applied a clock pulse cp from a clock pulse generator 63. The output of AND gate 62 goes to a sample drive circuit 64 coupled to the input of amplifier 1.

The output voltage Vo of the sample hold circuit decays gradually due to drift, and then the output frequency of the V/F converter increases. But the AND-gate 62 does not yet operate. The greater the drift, the more the output frequency of the V/F converter increases until finally coincidence between a clock pulse 63 and the output V*f* of 61 takes place, as shown in FIG. 2 (wave form C). The AND-gate generates a pulse which is fed into sample drive circuit 64. And the sample drive circuit 64 produces an output VC acting to compensate the output of the sample hold circuit in the positive direction during the time $\tau$ 3 so as to effect the necessary correction.

As shown in FIG. 2, clock pulse *cp* (wave form A) has a fixed width $\tau$ 1 and a constant period $T_1$ and the pulse train signal VF (waveform B) has a fixed width $\tau$ 2 and a variable period $T_2$ which is uniquely determined by the output voltage of the sample hold circuit.

The width and period of the clock pulse and the pulse train signal are so chosen that the system effects compensation by adjusting the correction signal Vc so that the range of variable period $T_2$ lies within the period $T_1$ of the clock pulse. If the condition is satisfied, the output of the sample hold circuit is kept within a specified limit.

A voltage-frequency converter 61 having any one of the transfer characteristics shown in FIG. 4(A) to (H) can be used. But it is evidently better to use a V/F converter which has a transfer curve of the type shown in FIG. 4 (B), (C), (D), (F), or (G).

Figure 3:
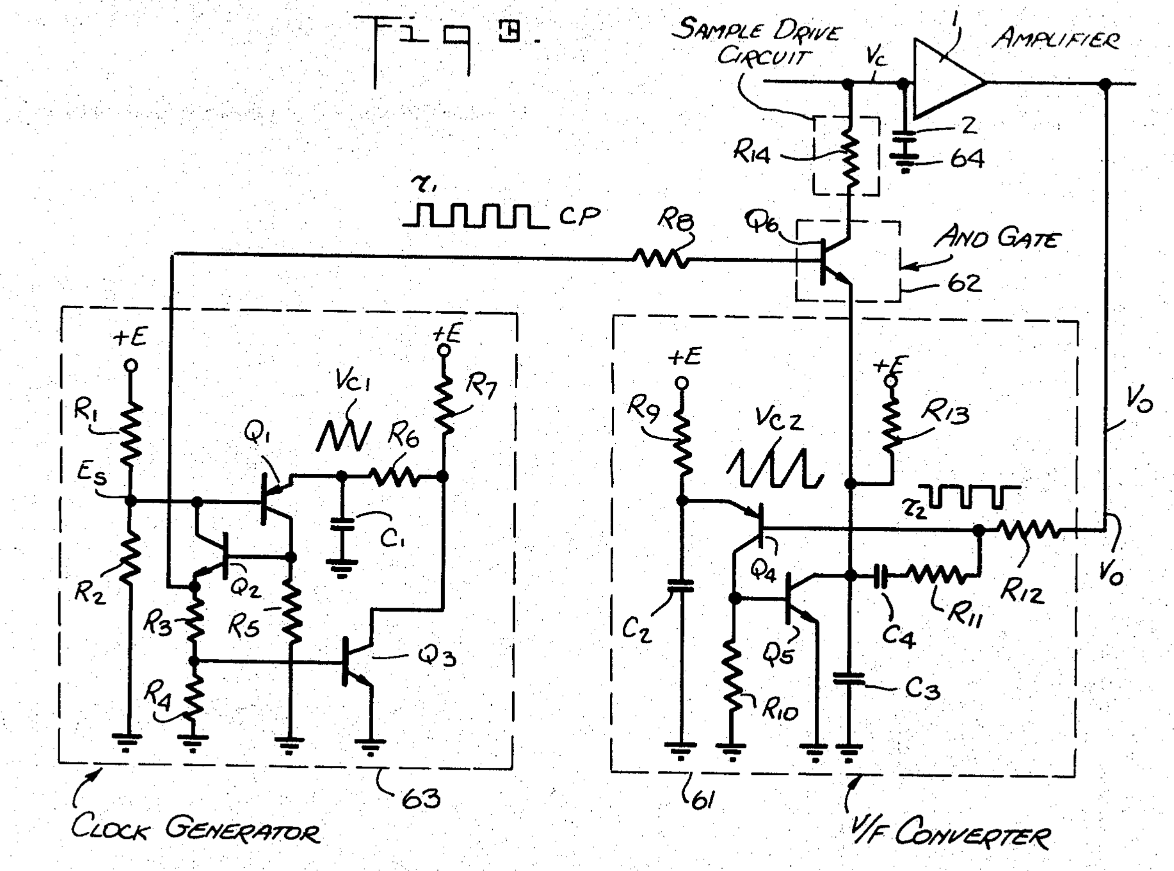
FIG. 3 is the schematic circuit of the block diagram shown in FIG. 1.
Figure 4:
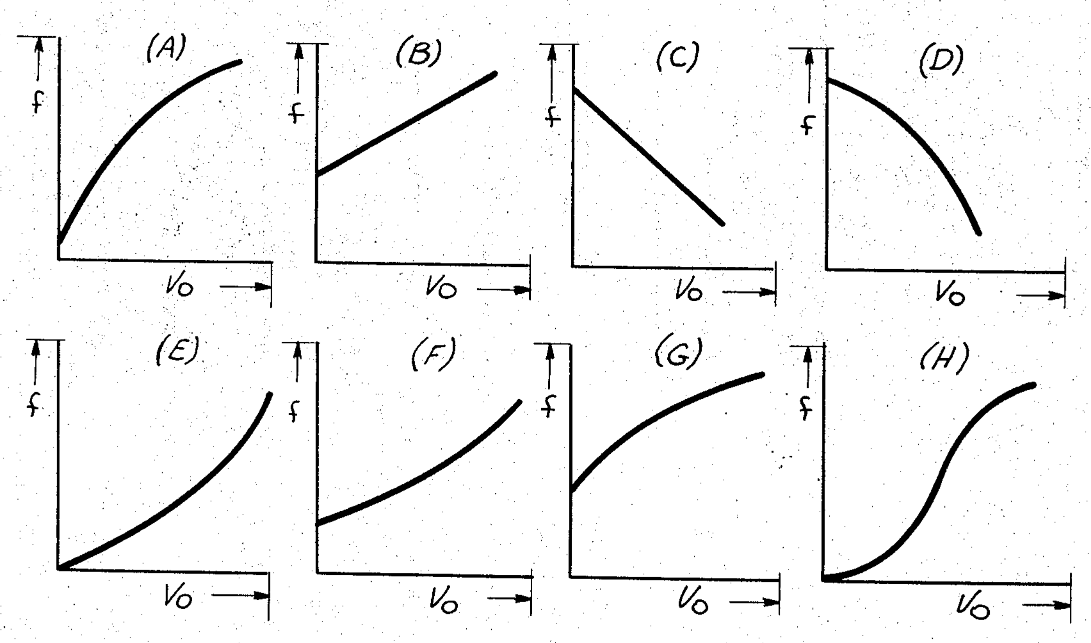
FIG. 4 (A–H) illustrates the V/F characteristics of the converter.

In FIG. 3 a practical example of a compensation circuit is shown. The voltage-to-frequency converter 61 includes two transistors Q4 and Q5. The converter converts the output voltage V*o* of the sample hold circuit to a pulse train signal V*f* with a frequency *f*, where f is a function of the output voltage V*o* of the sample hold circuit as shown in FIG. 4 (D).

The voltage V*c*2 which is produced by the resistance-capacitance series circuit $R_o$, $C_2$ and voltage +E is applied to the emitter of transistor Q4 and is compared with the output voltage Vo of the sample hold circuit which is applied to the base of transistor Q4 through a resistor $R_{12}$. When voltage $Vc2$ is greater than output voltage $Vo$, the transistor Q4 conducts. The collector current of the transistor Q4 flows into the base of the transistor Q5. This renders transistor Q5 conductive.

The collector of transistor Q5 is pulled up to the level of voltage +E through resistor $R_{13}$ and is also connected to the base of the transistor Q4 through resistor $R_{11}$ and capacitor $C_4$. The capacitor $C_4$ is charged to (+E−Vo) volts at its initial state when transistors Q4 and Q5 are at cut-off. When both transistors start conducting, the base potential of transistor Q4 is further lowered by the effect of the charge of capacitor $C_4$. That is, a positive feedback effect occurs. Then the stored charge in capacitor $C_2$ is rapidly discharged through the transistors Q4 and Q5. At the same time the stored charge in capacitor $C_4$ is discharged through resistor $R_{11}$ and transistor Q4 and then the base potential of the transistor Q4 goes down to ground level, making transistor Q4 move into a cut-off state. As a result of the positive feedback effect, transistors Q4 and Q5 again return to the cut-off state.

The waveform of voltage $Vc2$ is a saw-tooth, its frequency being in inverse proportion to the amplitude of voltage $Vo$. And the output of transistor Q5, which is the output of the converter, is a pulse train signal with a width $\tau$ 2, an amplitude +E and a frequency in inverse proportion to the amplitude of voltage Vo. The width $\tau$ 2 is determined by capacitor $C_4$, resistor $R_{11}$ and the voltage charge (+E−$Vo$), and it is varied by the output voltage Vo of the sample hold circuit. But in practice this is negligible. The capacitor $C_3$ provides means to eliminate noise.

Clock pulse generator 63 yields a clock pulse cp with a constant width $\tau$ 1 and a fixed period $T_1$. The clock pulse generator consists of thee transistors Q1, Q2 and Q3. Voltage Vc1 is the voltage across a capacitor $C_1$ which is charged through the resistors $R_6$ and $R_7$ and is applied to the emitter of transistor Q1. A voltage Es which is determined by the resistors $R_1$ and $R_2$ and a supply voltage +E is applied to the base of the transistor Q1.

When the voltage Vcl exceeds voltage Es, transistor Ql conducts, and its collector current flows into resistor $R_5$ and the base of transistor Q2. The collector of transistor Q1 is connected to the base of transistor Q1 and the emitter of transistor Q2 is connected to ground through resistors $R_3$ and $R_4$. The voltage across resistor $R_4$ is applied to the base of transistor Q3. The collector of transistor Q3 is connected to the junction of the resistors $R_6$ and $R_7$. Transistor Q3 provides means to arrest charging into capacitor $C_1$.

Initially the charge on capacitor $C_1$ is zero and transistors Q1, Q2 and Q3 are in the cut-off state. After an elapsed time, voltage Vc1 increases, then the transistor Ql starts conducting, this being followed by conduction of transistor Q2. The positive feedback effect makes transistors Ql and Q2 conduct rapidly. Thereafter, transistor Q3 proceeds to conduct. At this moment, the junction of resistors $R_6$ and $R_7$ is pulled down to ground level by transistor Q3. This halts charging of capacitor $C_1$. The charge stored in capacitor $C_1$ is discharged through transistors Q1, Q2 and resistor $R_6$. But in this case, since resistors $R_3$, $R_4$, $R_5$ and $R_6$ are so chosen that:

$$R_5 >> R_6 > (R_3 + R_4),$$

the time constant of this charge is determined by capacitor $C_1$ and the resistance value $(R_3 + R_4)$.

When capacitor $C_1$ is discharged to zero, transistors Q1 and Q2 are rapidly forced into the cut-off state by the positive feedback effect. Clock generator 63 repeats this process and produces a pulse of a constant width $\tau$ 1 and a fixed period $T_1$.

As shown in FIG. 3, AND-gate 62 consists of a transistor Q6. The clock pulse cp is fed into the base of transistor Q6 and the pulse train signal Vf is applied to the emitter thereof. The output of AND-gate 62 is connected to the input of the sample hold circuit through resistor $R_{14}$ which constitutes the sample drive circuit 64. When coincidence occurs between the clock pulse and the pulse train signal, transistor Q6 conducts, then voltage $Vc$ which has a width $\tau$ 3 as shown in FIG. 2 (wave form C), is applied to the sample hold circuit to compensate for drift.

The modified arrangement illustrated in FIG. 5 shows a compensation scheme which can compensate bidirectional drift. An AND-gate 62', a sample drive circuit 64', a one-half divider 65 and a NOT circuit 66 are added to the figures shown in FIG. 1. In this scheme the correction for upward drift is carried out by the circuits comprising AND-gate 62 and sample drive circuit 64, and the correction for downward drift is done by the circuits comprising And-gate 62', NOT circuit 66 and sample drive circuits 64' and those corrections can be made by time-sharing base.

In the embodiments described above, drift compensating circuit 6 is connected to the sample hold circuit. When the change of input signal exceeds the resolution of the compensation circuit, the output voltage Vo is forced to follow the input signal change regardless of the drift compensating action. Accordingly, the drift-compensated circuit has no influence at all on a set-point change ordinarily made by an operator

I claim:

1. A drift-compensated sample hold circuit comprising:

a. a sample hold circuit constituted by an amplifier and a memory capacitor,
b. a converter coupled to the output of said sample hold circuit to convert the output thereof to a pulse train signal having a frequency which is a function of the output voltage of said sample hold circuit,
c. a clock pulse generator yielding a clock pulse signal having a predetermined frequency,
d. an AND-gate coupled to said converter and said generator to receive said pulse train signal and said clock pulse signal and yielding an output signal only when said signals overlap, and
e. a sample drive circuit coupled to the input of said sample hold circuit for delivering a compensation signal thereto in response to the output signal of said gate.

* * * * *